United States Patent
Sakata et al.

(10) Patent No.: US 10,205,335 B2
(45) Date of Patent: Feb. 12, 2019

(54) STORAGE BATTERY MANAGEMENT DEVICE, METHOD, AND COMPUTER PROGRAM PRODUCT

(71) Applicant: Kabushiki Kaisha Toshiba, Tokyo (JP)

(72) Inventors: Yasuji Sakata, Tokyo (JP); Mami Mizutani, Tokyo (JP); Takenori Kobayashi, Tokyo (JP); Tomohiro Toyosaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 14/772,041

(22) PCT Filed: Feb. 24, 2015

(86) PCT No.: PCT/JP2015/055229
§ 371 (c)(1),
(2) Date: Sep. 1, 2015

(87) PCT Pub. No.: WO2016/135853
PCT Pub. Date: Sep. 1, 2016

(65) Prior Publication Data
US 2016/0372935 A1    Dec. 22, 2016

(51) Int. Cl.
*H02J 7/00* (2006.01)
*G01R 31/36* (2006.01)
*H01M 10/48* (2006.01)

(52) U.S. Cl.
CPC .............. *H02J 7/007* (2013.01); *G01R 31/36* (2013.01); *H01M 10/48* (2013.01); *H02J 7/00* (2013.01);
(Continued)

(58) Field of Classification Search
CPC .............. H02J 7/0021; H02J 2007/005; H02J 2007/0049; H02J 2007/0096; H02J 7/00;
(Continued)

(56) References Cited

U.S. PATENT DOCUMENTS 5,633,573 A * 5/1997 van Phuoc ......... G01R 31/3655
320/128
6,534,954 B1   3/2003 Plett
(Continued)

FOREIGN PATENT DOCUMENTS

JP    2001-266957 A    9/2001
JP    2007-024687 A    2/2007
(Continued)

OTHER PUBLICATIONS

International Search Report and Written Opinion issued in related PCT Application No. PCT/JP2015/055229 dated May 19, 2015, 8 pages.
(Continued)

*Primary Examiner* — Nathaniel R Pelton
*Assistant Examiner* — Michael N Dibenedetto
(74) *Attorney, Agent, or Firm* — Baker Botts L.L.P.

(57) ABSTRACT

According to one embodiment, a storage battery management device includes a chargeable/dischargeable capacity table, a controller, and a communication controller. The chargeable/dischargeable capacity table stores therein in advance a chargeable/dischargeable capacity corresponding to a temperature, a state of charge (SOC), a required charge rate or discharge rate, and a battery degradation rate of a secondary battery. The controller calculates an actual chargeable/dischargeable capacity by referring to the chargeable/dischargeable capacity table based on the temperature, the SOC, the required charge rate or discharge rate, and the battery degradation rate of the secondary battery. The communication controller informs a host device about the chargeable/dischargeable capacity of the secondary battery.

8 Claims, 11 Drawing Sheets

UNIT:kWh

| CHARGED AT HALF-HOUR RATE | | | | | | | | | | | (SOH=0%) |
|---|---|---|---|---|---|---|---|---|---|---|---|
| CHARGED AT ONE-HOUR RATE | | | | | | | | | | | (SOH=0%) |
| CHARGED AT TWO-HOUR RATE | | | | | | | | | | | (SOH=0%) |
| TEMPERA-TURE/SOC | 0% | 10% | 20% | 30% | 40% | 50% | 60% | 70% | 80% | 90% | 100% |
| -20°C | 88 | 79 | 70 | 62 | 53 | 44 | 35 | 26 | 18 | 9 | 0 |
| -10°C | 110 | 99 | 88 | 77 | 66 | 55 | 44 | 33 | 22 | 11 | 0 |
| 0°C | 132 | 119 | 106 | 92 | 79 | 66 | 53 | 40 | 26 | 13 | 0 |
| 10°C | 154 | 139 | 123 | 108 | 92 | 77 | 62 | 46 | 31 | 15 | 0 |
| 20°C | 176 | 158 | 141 | 123 | 106 | 88 | 70 | 53 | 35 | 18 | 0 |
| 30°C | 198 | 178 | 158 | 139 | 119 | 99 | 79 | 59 | 40 | 20 | 0 |
| 40°C | 220 | 198 | 176 | 154 | 132 | 110 | 88 | 66 | 44 | 22 | 0 |

(52) U.S. Cl.
CPC ..... *H02J 7/0021* (2013.01); *H02J 2007/0096* (2013.01)

(58) Field of Classification Search
CPC .......... H02J 7/007; H02J 7/003; H02J 7/0008; H02J 7/0026; H02J 7/042; H02J 7/044; H02J 7/045; H02J 7/047; H02J 2007/004; H02J 2007/0037; H02J 2007/0067; H02J 2007/0098; G01R 31/36; H01M 10/48; H01M 10/482; H01M 10/486
USPC ..................... 320/132, 144, 150; 361/679.01
See application file for complete search history.

(56) References Cited

U.S. PATENT DOCUMENTS

| | | | |
|---|---|---|---|
| 7,683,579 | B2 | 3/2010 | Kim et al. |
| 2006/0284618 | A1 | 12/2006 | Cho et al. |
| 2007/0001679 | A1* | 1/2007 | Cho, II ............... G01R 31/3679 324/426 |
| 2011/0031048 | A1* | 2/2011 | Ohkura ............... G01R 31/3658 180/65.1 |
| 2014/0177145 | A1 | 6/2014 | Kawahara et al. |
| 2014/0266059 | A1* | 9/2014 | Li ....................... B60L 11/1861 320/132 |
| 2014/0312910 | A1 | 10/2014 | Cho et al. |

FOREIGN PATENT DOCUMENTS

| | | |
|---|---|---|
| JP | 2008-060032 A | 3/2008 |
| JP | 2010-127729 A | 6/2010 |
| JP | 2011-172415 A | 9/2011 |
| JP | 5292375 B2 | 6/2013 |
| JP | 2013-183509 A | 9/2013 |
| JP | 2013-195232 A | 9/2013 |
| JP | 2014-011060 A | 1/2014 |
| JP | 2014-119265 A | 6/2014 |
| JP | 2014-119397 A | 6/2014 |
| JP | 2014-164853 A | 9/2014 |
| JP | 2015-030452 A | 2/2015 |
| KR | 10-2011-0081604 A | 7/2011 |
| WO | 20141147725 A1 | 9/2014 |

OTHER PUBLICATIONS

Office Action issued in related Korean Application No. 10-2015-7023863, dated Aug. 23, 2016 (15 pages).

Office Action issued in related EP Application No. 15753601.2, dated May 26, 2017 (6 pages).

* cited by examiner

FIG.8

CHARGED AT HALF-HOUR RATE (SOH=0%)

CHARGED AT ONE-HOUR RATE (SOH=0%)

CHARGED AT TWO-HOUR RATE (SOH=0%)  UNIT:kWh

| TEMPERATURE/SOC | 0% | 10% | 20% | 30% | 40% | 50% | 60% | 70% | 80% | 90% | 100% |
|---|---|---|---|---|---|---|---|---|---|---|---|
| -20°C | 88 | 79 | 70 | 62 | 53 | 44 | 35 | 26 | 18 | 9 | 0 |
| -10°C | 110 | 99 | 88 | 77 | 66 | 55 | 44 | 33 | 22 | 11 | 0 |
| 0°C | 132 | 119 | 106 | 92 | 79 | 66 | 53 | 40 | 26 | 13 | 0 |
| 10°C | 154 | 139 | 123 | 108 | 92 | 77 | 62 | 46 | 31 | 15 | 0 |
| 20°C | 176 | 158 | 141 | 123 | 106 | 88 | 70 | 53 | 35 | 18 | 0 |
| 30°C | 198 | 178 | 158 | 139 | 119 | 99 | 79 | 59 | 40 | 20 | 0 |
| 40°C | 220 | 198 | 176 | 154 | 132 | 110 | 88 | 66 | 44 | 22 | 0 |

FIG.9

DISCHARGED AT HALF-HOUR RATE (SOH=0%)
DISCHARGED AT ONE-HOUR RATE (SOH=0%)
DISCHARGED AT TWO-HOUR RATE (SOH=0%)

UNIT:kWh

| TEMPERA-TURE/SOC | 0% | 10% | 20% | 30% | 40% | 50% | 60% | 70% | 80% | 90% | 100% |
|---|---|---|---|---|---|---|---|---|---|---|---|
| -20°C | 0 | 8 | 16 | 24 | 32 | 40 | 48 | 56 | 64 | 72 | 80 |
| -10°C | 0 | 10 | 20 | 30 | 40 | 50 | 60 | 70 | 80 | 90 | 100 |
| 0°C | 0 | 12 | 24 | 36 | 48 | 60 | 72 | 84 | 96 | 108 | 120 |
| 10°C | 0 | 14 | 28 | 42 | 56 | 70 | 84 | 98 | 112 | 126 | 140 |
| 20°C | 0 | 16 | 32 | 48 | 64 | 80 | 96 | 112 | 128 | 144 | 160 |
| 30°C | 0 | 18 | 36 | 54 | 72 | 90 | 108 | 126 | 144 | 162 | 180 |
| 40°C | 0 | 20 | 40 | 60 | 80 | 100 | 120 | 140 | 160 | 180 | 200 |

*SHOWN IN PARENTHESES ARE DISCHARGEABLE CAPACITY

STORAGE BATTERY MANAGEMENT DEVICE, METHOD, AND COMPUTER PROGRAM PRODUCT

CROSS-REFERENCE TO RELATED APPLICATIONS

This application is national stage application of International Application No. PCT/JP2015/055229, filed Feb. 24, 2015, which designates the United States, the entire contents of which are incorporated herein by reference.

TECHNICAL FIELD

Embodiments described herein of the present invention relate generally to a storage battery management device, a method, and a computer program product.

BACKGROUND ART

In recent years, safe and clean natural renewable energy such as solar power generation and wind power generation has been introduced. However, the output of natural renewable energy is not stable, and the mass introduction may negatively affect the voltage and frequency of power systems. If the supply of natural renewable energy largely exceeds the power demand, the natural renewable energy power generation systems need to be stopped, resulting in reduced utilization of power generation facilities.

To solve such problems, a large-scale storage battery system using secondary batteries is added to the power generation systems, and is expected to prevent output fluctuations of the natural energy by charging/discharging power to and from the storage batteries, and to store surplus power in the storage batteries.

A storage battery system for power systems is used to prevent output fluctuations of natural renewable energy and to stabilize frequency in power systems. When a storage battery system is used for such purposes, the storage battery repeats charging and discharging constantly, and there is little time to stop the system. Conventionally, a current integration method has been used to estimate the state of charge (SOC) of a storage battery. However, using the storage battery in such a way so as to repeat charging and discharging constantly may cause current measurement errors to be accumulated and may not be able to estimate the SOC correctly, thus affecting the operation of the storage battery system.

More specifically, when an SOC estimation value is estimated smaller than the real value, the apparent dischargeable capacity becomes smaller. As a result, the storage battery system may not be able to operate efficiently. If the SOC estimation value is estimated larger than the real value, the storage battery may reach the end-of-discharge voltage ($V_{lower}$) before the SOC becomes 0%. As a result, the storage battery system may stop unexpectedly.

The present invention has been made in view of the above problem, and an object of the present invention is to correctly estimate the actual chargeable/dischargeable capacity even when a storage battery system repeats charging and discharging constantly, and to provide a storage battery management device, a method, and a computer program capable of stably operating the storage battery system.

BRIEF DESCRIPTION OF DRAWINGS

FIG. 8 is an explanatory diagram illustrating an example of a chargeable power amount prediction table at a particular battery degradation rate;

FIG. 9 is an explanatory diagram illustrating an example of a dischargeable power amount prediction table at a particular battery degradation rate;

MODE(S) FOR CARRYING OUT THE INVENTION DETAILED DESCRIPTION

In general, according to an embodiment, a storage battery management device comprises a chargeable/dischargeable capacity table, a controller, and a communication controller. The chargeable/dischargeable capacity table stores therein in advance a chargeable/dischargeable capacity corresponding to a temperature, a state of charge (SOC), a required charge rate or discharge rate, and a battery degradation rate of a secondary battery. The controller calculates an actual chargeable/dischargeable capacity by referring to the chargeable/dischargeable capacity table based on the temperature, the SOC, the required charge rate or discharge rate, and the battery degradation rate of the secondary battery. The communication controller informs a host device about the chargeable/dischargeable capacity of the secondary battery.

Embodiments will now be described with reference to the accompanying drawings.

[1] First Embodiment

Figure 1:
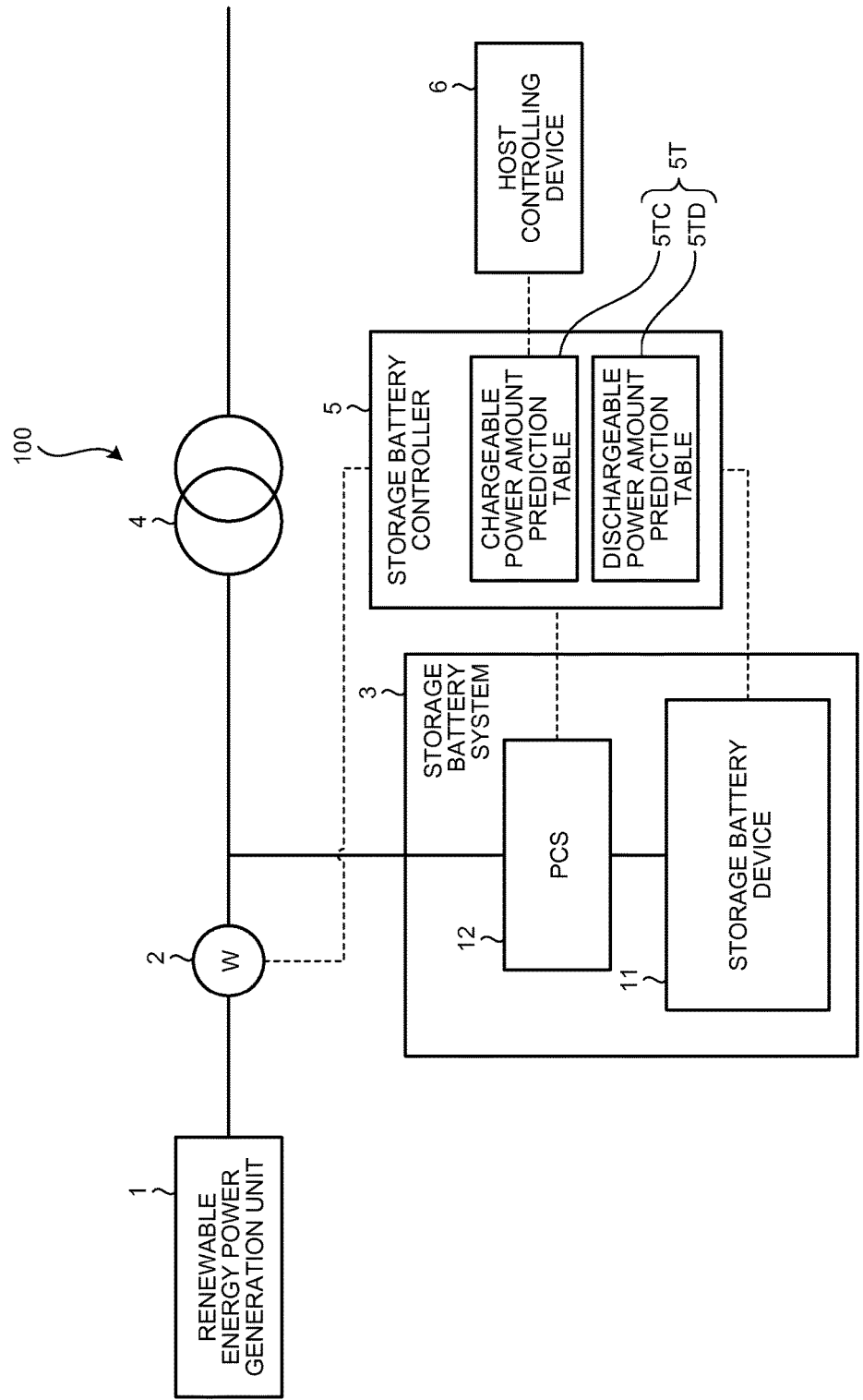
FIG. 1 is a schematic configuration diagram of a natural renewable energy power generation system including a storage battery system.

FIG. 1 is a schematic configuration diagram of a natural renewable energy power generation system including a storage battery system.

A natural renewable energy power generation system 100 includes: a natural renewable energy power generation unit 1 that uses natural energy (renewable energy) such as solar light, hydraulic power, wind power, biomass, and geothermal, and is capable of outputting the energy as system power; a power meter 2 that measures the power generated by the natural renewable energy power generation unit 1; a plurality of storage battery systems 3 that charge surplus power and discharge deficient power of the natural renewable energy power generation unit 1 based on the measurement results by an anemometer and the power meter 2, and output the resulting power including superimposition of the charged or discharged power on the power generated by the natural renewable energy power generation unit 1; a transformer 4 that converts the voltage of the power (including the case when the power output from the storage battery system 3 includes superimposition) output from the natural renewable energy power generation unit 1; a storage battery controller 5 that locally controls the storage battery system 3; and a host controlling device 6 that remotely controls the storage battery systems 3, which are not illustrated.

Figure 2:
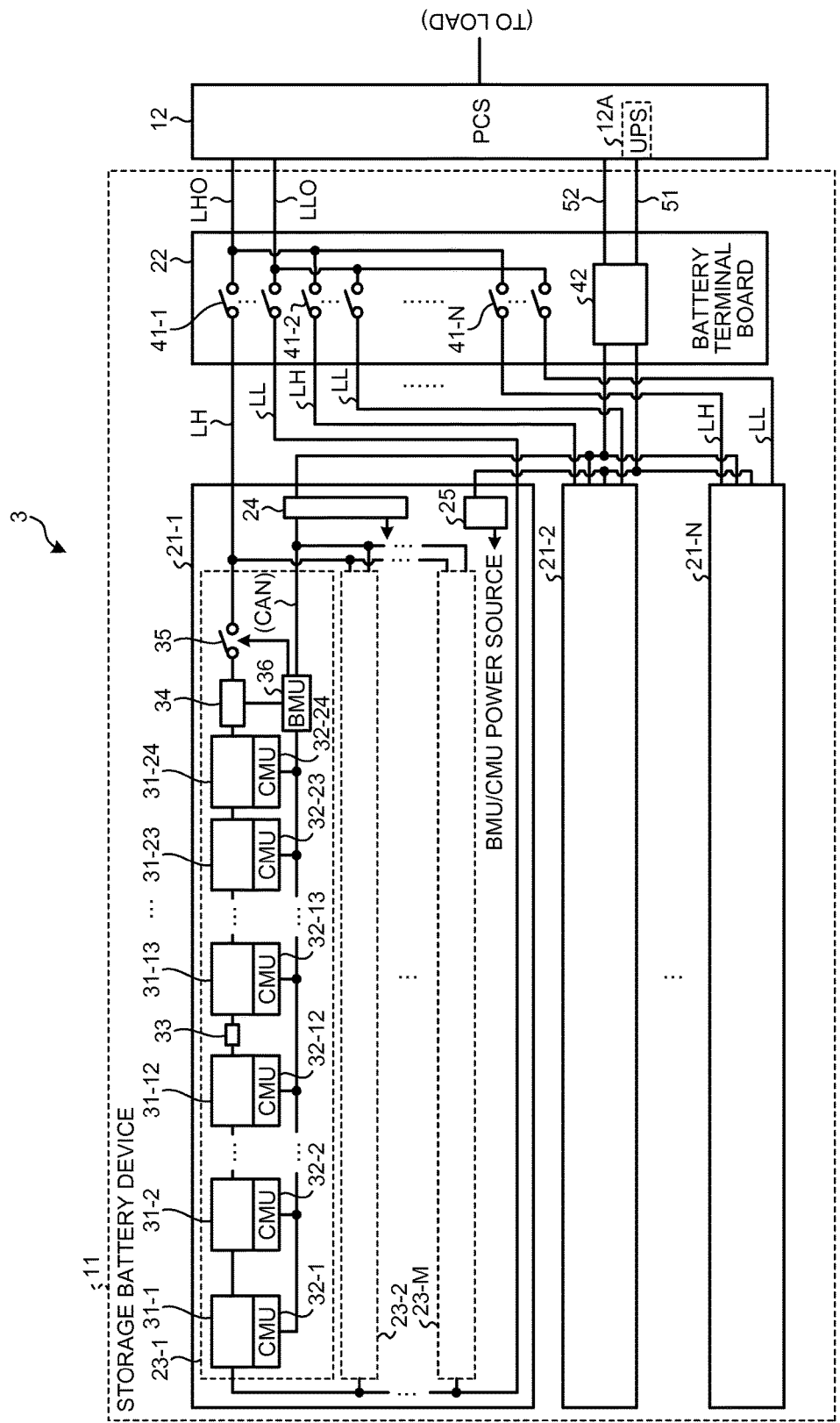
FIG. 2 is a schematic configuration block diagram of a storage battery system according to an a first embodiment.

FIG. 2 is a schematic configuration block diagram of a storage battery system according to the present embodiment.

The storage battery system 3, when roughly classified, includes a storage battery device 11 that stores power therein and a power conditioning system (PCS) 12 that converts direct current power supplied from the storage battery device 11 to alternating current power having a desired power quality and supplies it to a load.

The storage battery device 11, when roughly classified, includes a plurality of battery boards 21-1 to 21-N (N being a natural number) and a battery terminal board 22 to which the battery boards 21-1 to 21-N are connected.

Each of the battery boards 21-1 to 21-N includes a plurality of battery units 23-1 to 23-M (M being a natural number) connected in parallel with each other, a gateway device 24, and a direct current power source device 25 that supplies direct current power to operate a battery management unit (BMU) and a cell monitoring unit (CMU), which will be described later.

A configuration of a battery unit will now be described.

Each of the battery units 23-1 to 23-M is connected to output power lines (bus) LHO and LLO via a high potential side power supply line LH and a low potential side power supply line LL, and supplies power to the PCS 12, which is a main circuit.

Because the battery units 23-1 to 23-M have the same configuration, the battery unit 23-1 is explained as an example.

The battery unit 23-1, when roughly classified, includes a plurality (24 in FIG. 21) of cell modules 31-1 to 31-24, a plurality (24 in FIG. 21) of CMUs 32-1 to 32-24 provided respectively to the cell modules 31-1 to 31-24, a service disconnect 33 provided between the cell module 31-12 and the cell module 31-13, a current sensor 34, and a contactor 35. The cell modules 31-1 to 31-24, the service disconnect 33, the current sensor 34, and the contactor 35 are connected in series.

The cell modules 31-1 to 31-24 configure a battery pack by connecting a plurality of battery cells in series and in parallel. The cell modules 31-1 to 31-24 connected in series configure a battery pack group.

The battery unit 23-1 also includes a BMU 36. The communication line of each of the CMUs 32-1 to 32-24 and the output line of the current sensor 34 are connected to the BMU 36.

The BMU 36 controls the entire battery unit 23-1 under the control of the gateway device 24, and controls the opening and closing of the contactor 35 based on the communication results (voltage data and temperature data, which will be described later) with each of the CMUs 32-1 to 32-24 and the detection result of the current sensor 34.

The configuration of a battery terminal board will now be described.

The battery terminal board 22 includes a plurality of board breakers 41-1 to 41-N provided corresponding to the battery boards 21-1 to 21-N and a master device 42 configured as a microcomputer that controls the entire storage battery device 11.

The master device 42 is connected to the PCS 12 through a control power line 51 supplied via an uninterruptible power system (UPS) 12A of the PCS 12 and a control communication line 52 configured as Ethernet (registered trademark) and used to exchange control data.

Detailed configurations of the cell modules 31-1 to 31-24, the CMUs 32-1 to 32-24, and the BMU 36 will now be described.

Figure 3:
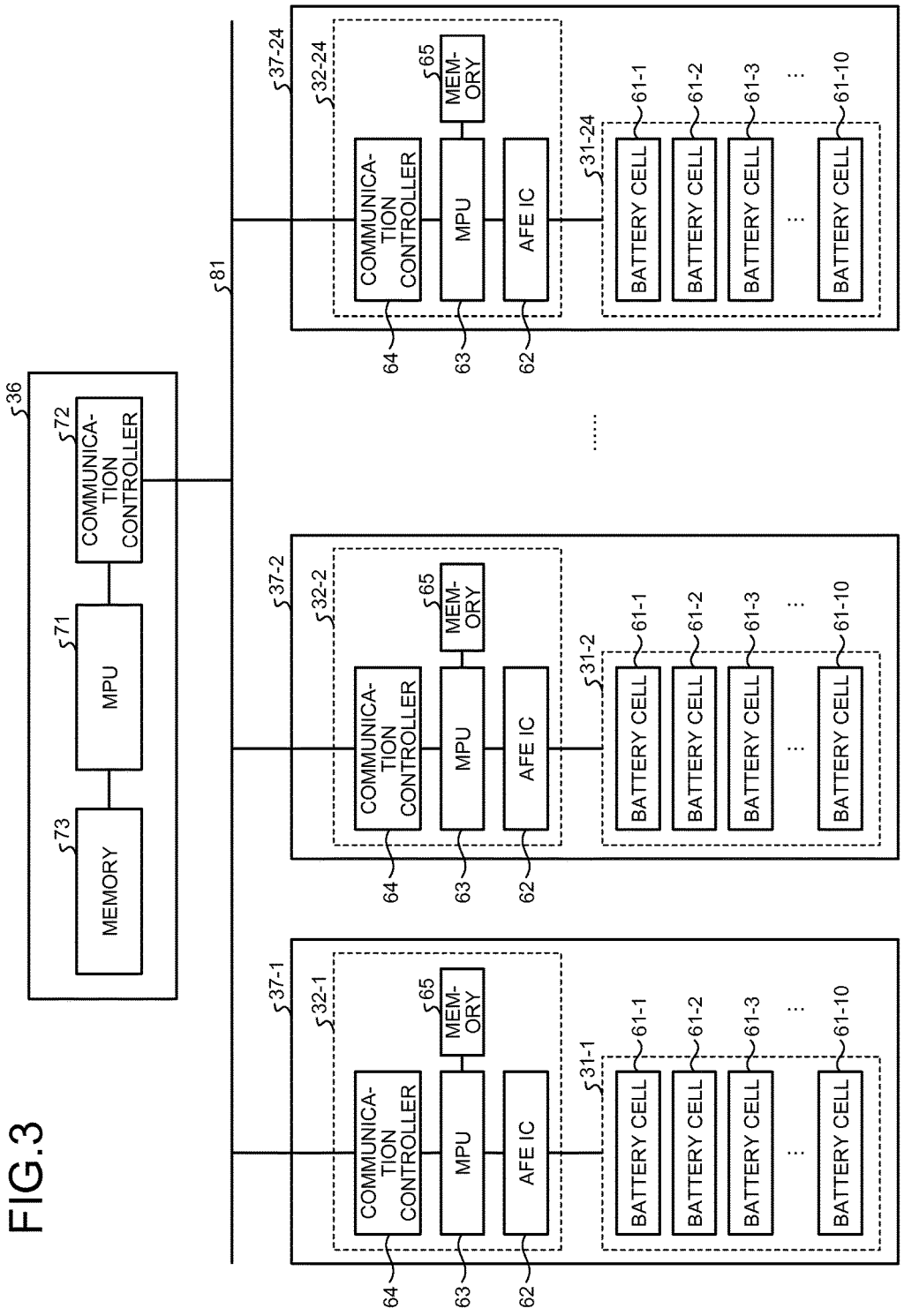
FIG. 3 is a detailed configuration diagram for explaining a cell module, a CMU, and a BMU.

FIG. 3 is a detailed configuration diagram for explaining a cell module, a CMU, and a BMU.

Each of the cell modules 31-1 to 31-24 includes a plurality (10 in FIG. 32) of battery cells 61-1 to 61-10 connected in series.

Each of the CMUs 32-1 to 32-24 includes an analog front end IC (AFE-IC) 62 used for measuring the voltage of the battery cells configuring the corresponding cell modules 31-1 to 31-24 and the temperature of a certain location, a microprocessor unit (MPU) 63 that controls the entire corresponding CMUs 32-1 to 32-24, a communication controller 64 in compliance with the controller area network (CAN) standard so as to perform the CAN communication with the BMU 36, and a memory 65 that stores therein voltage data corresponding to the voltage of each cell as well as temperature data.

In the following explanation, the configuration that combines each of the cell modules 31-1 to 31-24 and the corresponding CMUs 32-1 to 32-24 is referred to as battery modules 37-1 to 37-24. For example, a configuration that combines the cell module 31-1 and the corresponding CMU 32-1 is referred to as a battery module 37-1.

The BMU 36 includes an MPU 71 that controls the entire BMU 36, a communication controller 72 in compliance with the CAN standard so as to perform the CAN communication with the CMUs 32-1 to 32-24, and a memory 73 that stores therein voltage data and temperature data transmitted from the CMUs 32-1 to 32-24.

The storage battery controller 5 detects the power generated by the natural renewable energy power generation unit 1, and to ease the influence of the generated power on the power system, suppresses the output fluctuation of the generated power by using the storage battery device 11. The fluctuation suppression amount relative to the storage battery device 11 is calculated by the storage battery controller 5 or the host controlling device 6, and applied to the PCS 12 corresponding to the storage battery device 11 as a charge/discharge command.

It is assumed that the storage battery controller 5 estimates the chargeable/dischargeable power amount of the storage battery device 11.

The storage battery controller 5, as illustrated in FIG. 1, holds in advance a chargeable power amount prediction table 5TC and a dischargeable power amount prediction table 5TD to predict a chargeable power amount and a dischargeable power amount of the storage battery device 11 (hereinafter, when the two are treated as one, referred to as a chargeable/dischargeable power amount prediction table 5T).

The storage battery controller 5 handles the storage battery device 11 as one storage battery, and predicts the chargeable power amount or dischargeable power amount by using the current SOC, the battery temperature, the charge/discharge power, and the battery degradation rate of the storage battery device 11.

The predicted chargeable power amount or the dischargeable power amount is notified to the host controlling device 6, and the host controlling device 6 controls the charging/discharging of the storage battery device 11 based on the prediction values.

The chargeable power amount prediction table 5TC and the dischargeable power amount prediction table 5TD store therein the estimated results of the chargeable/dischargeable power amount at each state of a battery (battery temperature and SOC) simulated by using an equivalent circuit model of a secondary battery and the characteristic values of the secondary battery obtained in advance.

An equivalent circuit model of a secondary battery as a storage battery will now be described.

Figure 4:
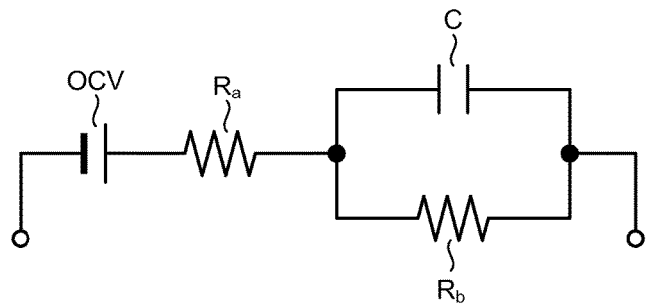
FIG. 4 is an explanatory diagram illustrating an equivalent circuit model of a secondary battery.

FIG. 4 is an explanatory diagram illustrating an equivalent circuit model of a secondary battery.

The equivalent circuit model of a secondary battery, as illustrated in FIG. 4, can be expressed by an open circuit voltage (OCV), reaction resistance Ra which is a resistance component that rises instantly immediately after a constant current pulse is applied, diffusion resistance Rb which is a resistance component that increases gradually while the constant current pulse is applied, and a capacitor component C.

The reaction resistance Ra is ion conduction resistance of a separator in a battery and is charge transfer resistance of positive and negative electrodes.

The diffusion resistance Rb is a resistance component generated due to the diffusion delay of ions in positive and negative active material particles.

The characteristic values of a secondary battery such as the open circuit voltage (OCV), the reaction resistance Ra, the diffusion resistance Rb, and the capacitor component C can be measured by a characteristic test of the secondary battery such as a constant current pulse method.

These various characteristic values change according to the state of the battery such as a battery temperature and the SOC. For example, the value of internal resistance (diffusion resistance Rb and diffusion resistance Rb) of a lithium ion battery increases as the temperature lowers, thereby reducing the chargeable or dischargeable capacity. Consequently, these characteristic values need to be obtained at every state of the battery.

Thus, the charging/discharging operation of a storage battery is simulated by using an equivalent circuit model of a secondary battery incorporated with these various characteristic values. The chargeable/dischargeable power amount at each state of the battery is calculated in advance, and recorded in a memory, which is not illustrated, mounted on the storage battery controller 5 as the chargeable/dischargeable power amount prediction table 5T.

The chargeable/dischargeable power amount of the storage battery changes not only by the current SOC and the battery temperature, but also by the magnitude of the charge/discharge power (charge/discharge rate: for example, two-hour rate, one-hour rate, and half-hour rate).

Figure 5:
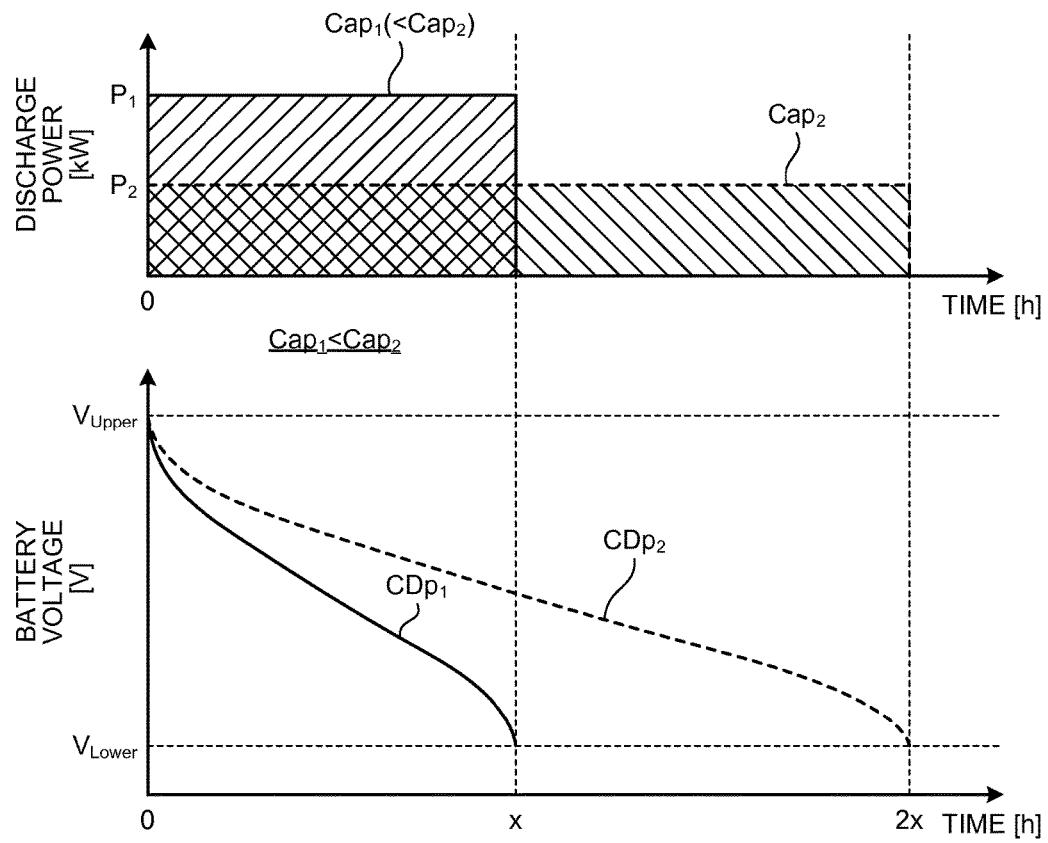
FIG. 5 is an explanatory diagram illustrating a dischargeable power amount when the discharge rate is different.

FIG. 5 is an explanatory diagram illustrating a dischargeable power amount when the discharge rate is different.

When a discharge capacity $Cap_1$ (in FIG. 5, corresponding to an area of the height P1 and width x), which is discharged at power $P_1$ corresponding to the one-hour rate, is compared with a discharge capacity $Cap_2$ (in FIG. 5, corresponding to an area of the height P2 and width 2x), which is discharged at power $P_2$ corresponding to the two-hour rate, they are expressed as follows:

$$Cap_1 < Cap_2$$

The substantial dischargeable power amount is larger when the power is discharged at the two-hour rate. This is because, in general, when the charge/discharge current is large, the voltage rises or drops sharply, thereby reducing the substantial chargeable/dischargeable capacity.

The reduction in the chargeable/dischargeable capacity described above is caused by the change in the internal resistance of a secondary battery. Such a charging/discharging operation of a storage battery can also be simulated by using the equivalent circuit model.

In the present embodiment, to improve the prediction accuracy, the chargeable power amount prediction table 5TC and the dischargeable power amount prediction table 5TD are prepared for each charge rate or discharge rate.

The secondary battery degrades with the charge/discharge cycle and over the time. Consequently, the internal resistance value increases and the battery capacity decreases. The degradation tendency of a secondary battery varies but in the equivalent circuit model, it is considered to appear especially with the increase in the reaction resistance Ra.

For example, it is known that the reaction resistance Ra of a battery at end of life (EOL) increases several times more than that of a battery at begin of life (BOL). The chargeable/dischargeable power amount of a secondary battery changes due to the changes in the internal resistance value.

In the present embodiment, a chargeable/dischargeable power amount after the degradation is predicted by identifying the increasing tendency of the internal resistance value and by estimating the degradation rate of the secondary battery.

More specifically, the ratio of the current internal resistance value relative to the internal resistance value obtained at BOL is calculated and defined as the degradation rate of the battery. A plurality of chargeable/dischargeable power amount prediction tables 5T are prepared in advance according to the degradation rate of the secondary battery, and the chargeable/dischargeable power amount is predicted based on the current battery degradation rate.

The definition of state of health (SOH: degradation state of a battery) of a secondary battery will now be described.

The SOH of a secondary battery can be defined in various ways, but because the internal resistance increases and the chargeable/dischargeable capacity decreases with the degradation of the secondary battery, it can be expressed by the internal resistance increasing rate and the capacity decreasing rate. For example, when the initial battery capacity is $Cap_0$, the current battery capacity is $Cap$, and the EOL battery capacity is $Cap_{EOL}$, the SOH of the secondary battery is given by the expression (1).

$$SOH(\%) = \left(1 - \frac{Cap}{Cap_0}\right) \Big/ \left(1 - \frac{Cap_{EOL}}{Cap_0}\right) \times 100 \quad (1)$$

For example, based on the initial battery capacity $Cap_0$, the EOL of an on-vehicle secondary battery is often defined as a point when the battery capacity lowered to 80% of the initial battery capacity $Cap_0$. In this case, the EOL battery capacity $Cap_{EOL}$ is defined by the expression (2).

$$Cap_{EOL} = Cap_0 \times 0.8 \quad (2)$$

When an internal resistance value is measured by using the constant current pulse method and the like, if the initial internal resistance value is $R_0$, the current internal resistance value is R, and the EOL internal resistance value is $R_{EOL}$, the SOH of the secondary battery is given by the expression (3).

$$SOH(\%) = \left(\frac{R}{R_0} - 1\right) \bigg/ \left(\frac{R_{EOL}}{R_0} - 1\right) \times 100 \quad (3)$$

For example, in a lithium ion battery as a secondary battery, the EOL internal resistance value $R_{EOL}$ increases several times more than the initial internal resistance value $R_0$.

Here, attention should be given to the fact that the battery capacity and the internal resistance value also change by the battery temperature, regardless of the battery degradation.

More specifically, the internal resistance value of a lithium ion battery increases as the temperature lowers, thereby reducing the chargeable/dischargeable capacity. On the other hand, the chargeable/dischargeable capacity of a lithium ion battery increases a little as the temperature increases, because the internal resistance value is reduced.

In other words, when the SOH of a secondary battery is estimated from the changes in the battery capacity and the internal resistance value, it must be measured under the same temperature condition. As long as the battery capacity and the internal resistance value can be measured continuously under the same temperature condition, it is possible to estimate the SOH of a battery.

However, in reality, it is not easy to measure the battery capacity and the internal resistance value of the operating storage battery system 3, while keeping the battery temperature constant. As a result, it is difficult to correctly identify the battery's degradation state.

The internal resistance estimation method disclosed in Patent Literature 4 or Patent Literature 5 is one of measures to solve such problems. The method estimates the direct current internal resistance of a battery by analyzing the correlation between the change of current and change of battery voltage during charging/discharging.

The internal resistance value of a secondary battery can be calculated by using any one of the total voltage of a series unit, the battery module voltage, and the voltage of each battery cell. The internal resistance value of an individual battery cell can be identified more in detail, in ascending order of the total voltage of a series unit, the battery module voltage, and the voltage of each battery cell.

When a secondary battery is being charged/discharged, the battery temperature changes constantly, not only due to the change in the surrounding temperature but also due to an influence such as internal heating of the secondary battery.

Consequently, unless it is possible to isolate changes in the internal resistance value due to the battery temperature and changes in the internal resistance value due to the battery degradation, the degradation state of the secondary battery cannot be identified correctly. Accordingly, the internal resistance value needs to be estimated repeatedly at every certain period, and the respective estimated values are clustered based on the average battery temperature and the average SOC at the time of analysis.

As a result, comparing the internal resistance estimation values under the same measurement conditions (battery temperature and SOC) can identify the increase.

In the internal resistance estimation method disclosed in Patent Literature 4 or Patent Literature 5, the influence of the reaction resistance Ra is stronger in the regression analysis results in a range where the frequency in wavelet transform is high. Because the degradation tendency of a lithium ion battery is considered to be apt to appear on this reaction resistance Ra, the increase tendency is identified by estimating the internal resistance value of the secondary battery in this high frequency range.

The calculation method of a degradation rate of a secondary battery using the internal resistance estimation method disclosed in Patent Literature 4 or Patent Literature 5 will now be described.

Figure 6:
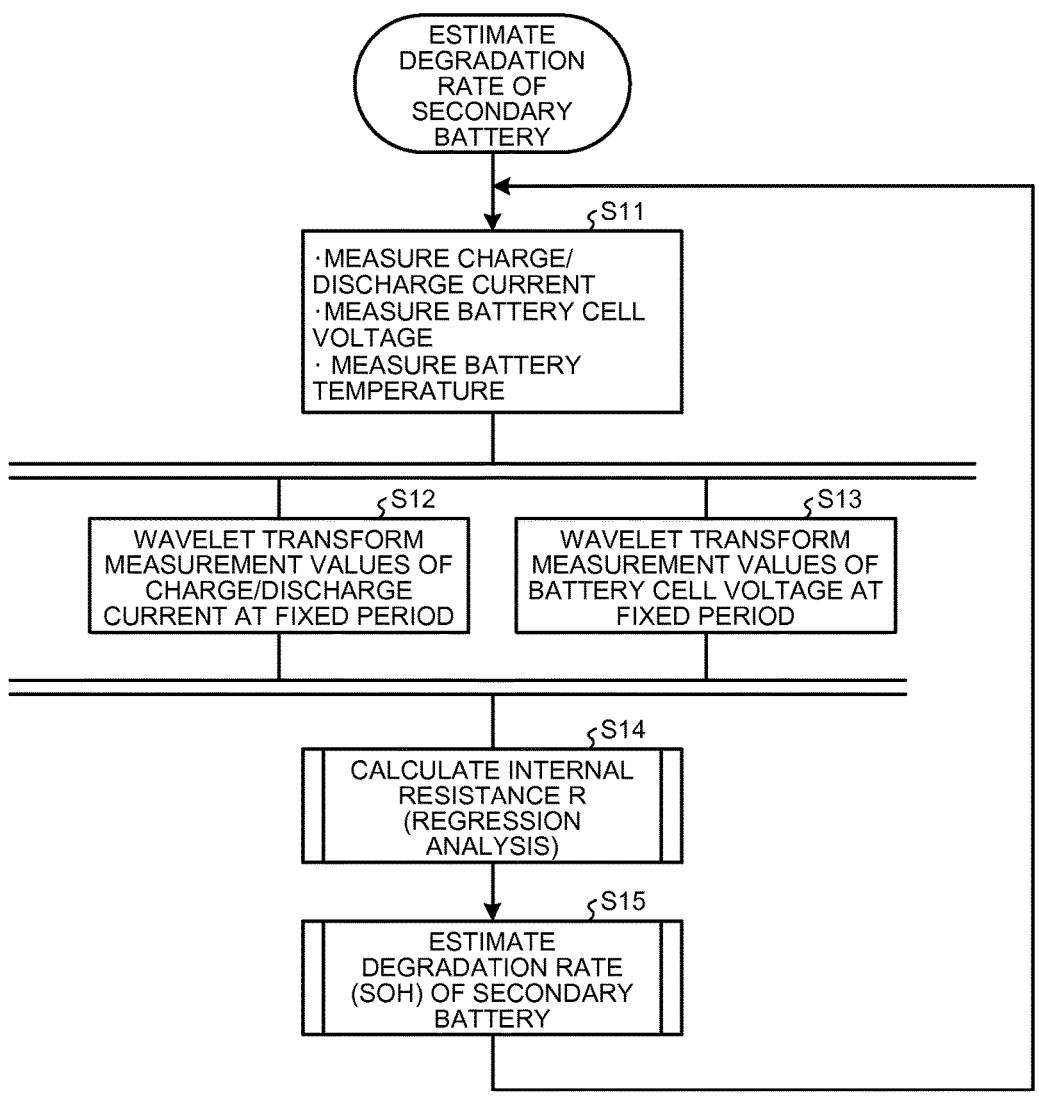
FIG. 6 is a process flowchart for estimating the degradation rate of a secondary battery.

FIG. 6 is a process flowchart for estimating the degradation rate of a secondary battery.

In the storage battery device 11 of the storage battery system 3, the charge/discharge current, the battery cell voltage, and the battery temperature are measured at a fixed period (for example, 100 ms) (S11).

The measured values of the charge/discharge current (correspond to a current waveform) measured within a certain period (for example, every several tens of minutes) are wavelet transformed, and a wavelet coefficient $W_\psi i(a, b)$ [a: dilation (scaling), b: shift] is calculated for each frequency (S12).

The measured values of the battery cell voltage (correspond to a voltage waveform) within the same period are wavelet transformed, and a wavelet coefficient $W_\psi(a, b)$ is calculated for each frequency (S13).

Based on the calculated wavelet coefficient $W_\psi i(a, b)$ of the charge/discharge current and the wavelet coefficient $W_\psi(a, b)$ of the battery cell voltage, an internal resistance value R(a) of the storage battery device 11 is calculated by the regression analysis given by the expression (4) (S14). The internal resistance value R(a) is calculated for each frequency.

$$R(a) = \frac{(W_\psi v)(a, b)}{(W_\psi i)(a, b)} \quad (4)$$

More specifically, when the analysis level of the wavelet transform is j, and the wavelet coefficients relative to the respective measurement values of the charge/discharge current and the battery cell voltage calculated within a certain analysis zone is Wi[j][k] (k=1, 2, ... n, n being the number of coefficients corresponding to the analysis zone width) and Wv[j] [k] (k=1, 2, ... n) respectively, the internal resistance value R[j] calculated by the regression analysis is given by the expression (5) below.

$$R[j] = \frac{n\sum_{k=1}^{n}(Wi[j][k] \times Wv[j][k]) - \sum_{k=1}^{n}Wi[j][k]\sum_{k=1}^{n}Wv[j][k]}{n\sum_{k=1}^{n}(Wi[j][k])^2 - \left(\sum_{k=1}^{n}Wi[j][k]\right)^2} \quad (5)$$

Here, as the frequency becomes higher (small analysis level), the internal resistance value R(a) becomes lower, and the influence of the reaction resistance Ra is considered to appear stronger. On the other hand, depending on the frequency, the estimation error may increase due to the influence such as noise from the measurement sensor, the battery temperature, and the SOC. As a result, the estimation accuracy is increased when the degradation rate of a secondary battery is estimated at the higher frequency side as well as the frequency when a decision coefficient $R^2$ of the regression analysis is high.

In this manner, the internal resistance value R(a) is estimated from the charge/discharge current and the battery cell voltage measured as required, and the values are clustered based on the average battery temperature and the average value of the SOC at the estimation zone, thereby identifying the increasing rate of the internal resistance value R(a) at each measurement condition.

More specifically, the medium and long-term changes of the internal resistance value R(a) are observed and the estimation values are compared, under the conditions such as the average battery temperature is 25 degrees Celsius and the average SOC is at 50%. Under these conditions, the relationship between the initial internal resistance estimation value and the current internal resistance estimation value is given by the expression (3), to estimate the degradation rate (SOH) of the secondary battery (S15).

Figure 7:
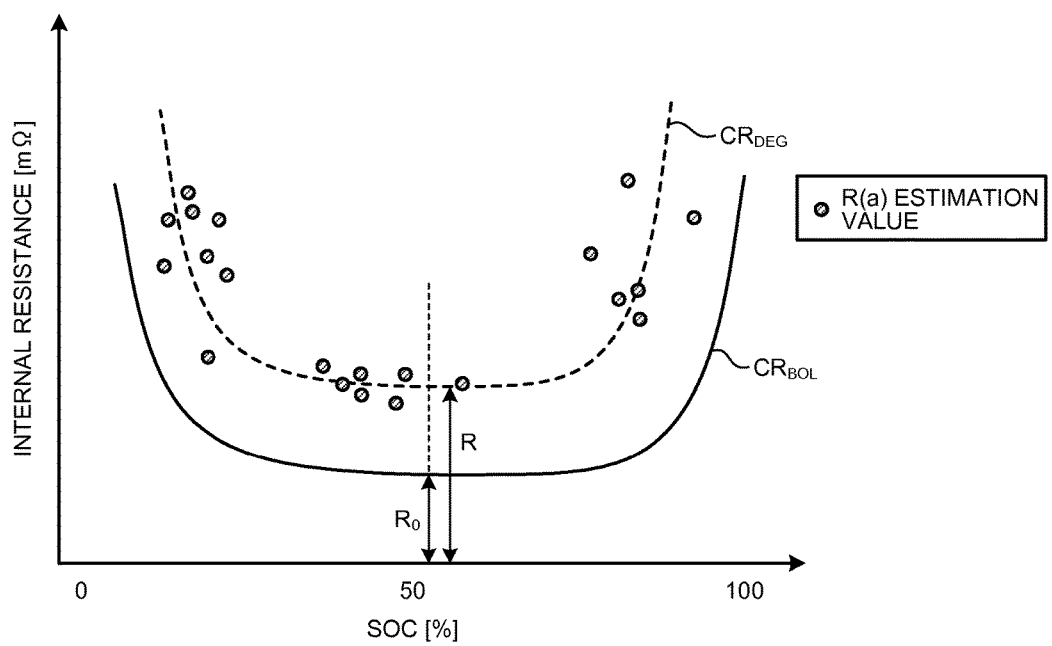
FIG. 7 is an explanatory diagram illustrating changes of internal resistance estimation values relative to the average SOC when the average battery temperature is the same.

FIG. 7 is an explanatory diagram illustrating changes of internal resistance estimation values relative to the average SOC when the average battery temperature is the same.

In FIG. 7, the internal resistance estimation values having the same average battery temperature in the estimation period (estimation zone) are illustrated. The internal resistance estimation value is set as the vertical axis and the average SOC is set as the horizontal axis.

The internal resistance value of the internal resistance characteristic $CR_{BOL}$ of a secondary battery at BOL changes by the average SOC, and as illustrated in FIG. 7, the internal resistance values are increased in the area where the average SOC is low as well as the area where the average SOC is high. The values form a U-shape in which the values become low when the average SOC is at and around 50%.

The internal resistance value increases with the degradation of a secondary battery, and as illustrated in the internal resistance characteristic $CR_{DEG}$ of a secondary battery estimated after the degradation, the internal resistance value (in FIG. 7, when the average SOC is at 50%, it is the internal resistance value R) of a secondary battery, for which a few years have passed since the operation, increases compared to the initial internal resistance value (=R0).

In the present embodiment, the battery degradation rate is estimated by identifying the increasing tendency of the internal resistance value corresponding to the degradation of a secondary battery.

From the above results, the chargeable/dischargeable power amount prediction table 5T held in the controller 52 predicts the chargeable/dischargeable power amount by using four parameters of the SOC, the battery temperature, the charge/discharge rate, and the battery degradation rate (SOH).

FIG. 8 is an explanatory diagram illustrating an example of a chargeable power amount prediction table at a particular battery degradation rate.

FIG. 9 is an explanatory diagram illustrating an example of a dischargeable power amount prediction table at a particular battery degradation rate.

In FIGS. 8 and 9, an example is illustrated when the SOH indicating the battery degradation rate of a secondary battery is at 0% (initial state). However, in practice, the chargeable power amount prediction table 5TC and the dischargeable power amount prediction table 5TD need to be created for a plurality of battery degradation rates, respectively. For example, the chargeable/dischargeable power amount prediction table 5T when the SOH of a secondary battery at EOL is at 100%, and the chargeable/dischargeable power amount prediction table 5T when the SOH is at 50%, which indicates the middle, are to be created in advance.

Then, a chargeable power amount corresponding to the degradation rate (SOH) of a storage battery is predicted from the chargeable power amount prediction table 5TC, or a dischargeable power amount corresponding to the degradation rate (SOH) of a storage battery is predicted from the dischargeable power amount prediction table 5TD.

More specifically, when the degradation rate SOH of a storage battery is at 0%, the battery temperature is 20 degrees Celsius, and the current SOC is at 40%, the chargeable power amount in the case of charging at the two-hour rate is 106 kWh, as illustrated in FIG. 8.

Similarly, when the degradation rate SOH of a storage battery is at 0%, the battery temperature is 30 degrees Celsius, and the current SOC is at 50%, the dischargeable chargeable power amount when discharged at the two-hour rate is 90 kWh, as illustrated in FIG. 9.

As described above, according to the present first embodiment, the chargeable power amount and the dischargeable power amount can be predicted with more certainty based on the state of a storage battery and the charge/discharge condition.

[2] Second Embodiment

The principle of the second embodiment will now be described.

When a secondary battery is used to suppress output fluctuations of natural renewable energy, the host controlling device that controls the secondary battery to charge and discharge within a certain range while constantly controlling the secondary battery so that the SOC at the secondary battery will not reach full charge or complete discharge. Because the chargeable/dischargeable capacity (actual capacity) of a storage battery reduces gradually with the degradation, the degradation of a battery needs to be taken into account to predict the chargeable/dischargeable power amount.

According to the present second embodiment, a margin is given to the battery capacity corresponding to the expected lifetime of a secondary battery, and the usage range of a storage battery is limited with the reference SOC at 50%.

Consequently, the host controlling device of the storage battery can control the charging/discharging of the storage battery within a predetermined capacity range (referred to as an operational capacity Cap_1) at any time in the expected lifetime of the secondary battery.

The operational range (usage range) of a battery may also be limited by using the SOC. For example, to limit the operational capacity to 100 kWh, the SOC can be limited between 20% and 80%. However, because the relationship between the SOC and the dischargeable capacity depends on the battery temperature and the degradation state, the correct dischargeable capacity cannot be calculated accurately by this method.

When a lithium ion battery is used as a secondary battery, the degradation of the lithium ion battery is faster in the high SOC range and the low SOC range, compared to that when the SOC is at 50%. Accordingly, by limiting the operational range (usage range) of the storage battery to a range where the SOC is at around 50% (particular reference SOC), the battery degradation can be reduced, thereby enabling a long life to be achieved.

According to the second embodiment, the chargeable power amount prediction table 5TC and the dischargeable power amount prediction table 5TD used in the first embodiment are used to predict the chargeable/dischargeable power amount of a secondary battery at EOL, estimate the actual capacity of the secondary battery during operation including that at EOL, and calculate the operational capacity so that the actual operational capacity during the expected lifetime falls within the actual capacity range, as well as an operation to shorten the battery life is not performed.

Figure 10:
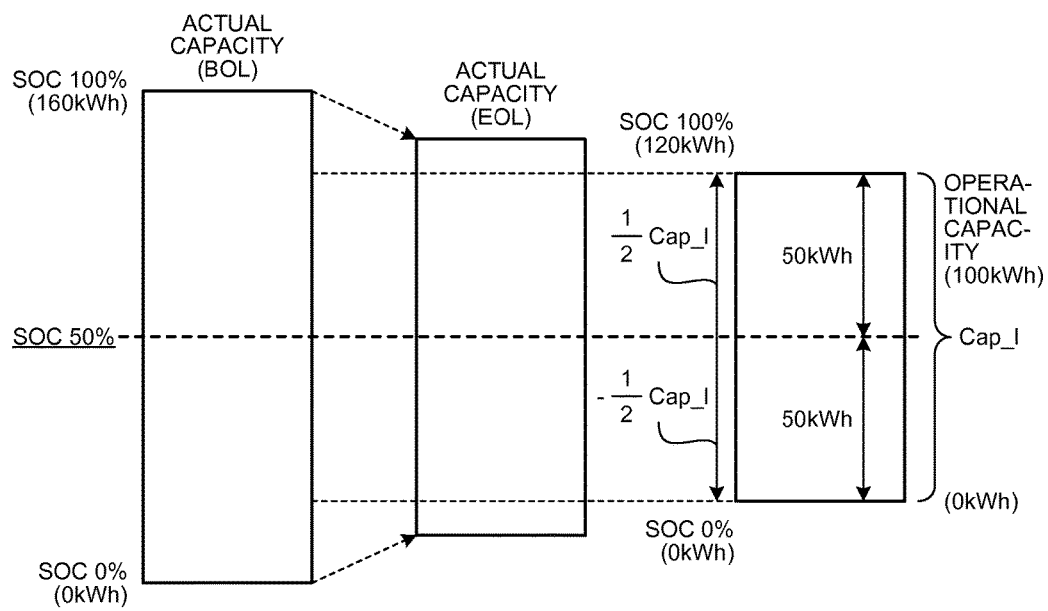
FIG. 10 is an explanatory diagram illustrating a specific example according to a second embodiment.

FIG. 10 is an explanatory diagram illustrating a specific example of the second embodiment.

As illustrated in the left-hand side of FIG. 10, when the SOC is at 100% at BOL, the actual capacity is 160 kWh. When the SOC is at 0% at BOL, the actual capacity is 0 kWh. In other words, the actual capacity as a secondary battery is 160 kWh.

When the chargeable/dischargeable power amount of a secondary battery at EOL is predicted by using the chargeable power amount prediction table 5TC and the dischargeable power amount prediction table 5TD used in the first embodiment, as illustrated in the middle of FIG. 10, the actual capacity is 120 kWh with the SOC at 100% at EOL and the actual capacity is 0 kWh with the SOC at 0% at EOL. In other words, the actual capacity as a secondary battery is 120 kWh.

As described above, because the degradation is faster in the high SOC range and the low SOC range, the usage range of the secondary battery should be limited to a range where the SOC is between 10% and 90% even at EOL. Accordingly, the preferable operational capacity is around 50 kWh with the reference SOC at 50% (actual capacity range: 10 kWh to 110 kWh) (that is, actual SOC is 8 to 92%).

In this manner, by specifying the actual capacity, the operational capacity of the secondary battery can be secured without fail without exceeding the actual capacity limit, because the actual capacity is always larger than the operational capacity at any operation within the expected lifetime. Accordingly, it is possible to perform an operation always with the same control without taking the degradation state into account.

Figure 11:
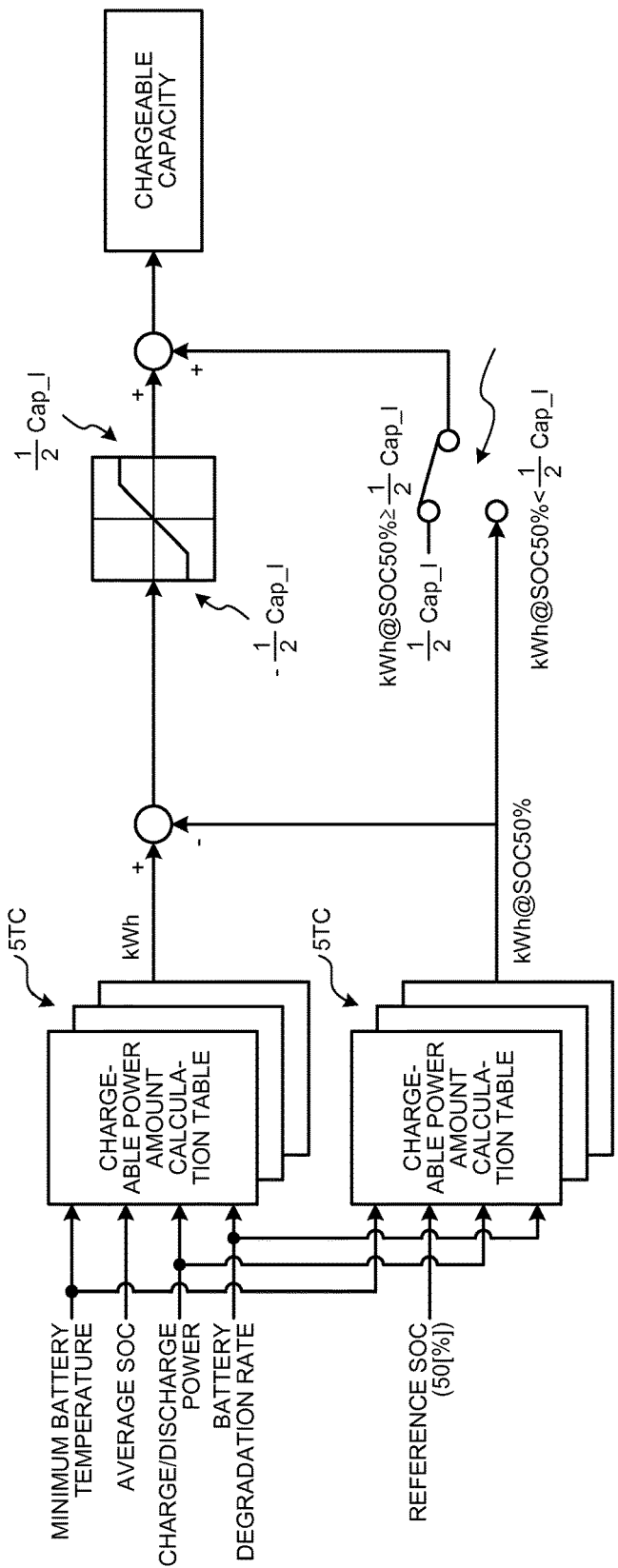
FIG. 11 is a block diagram of a calculation circuit that calculates a chargeable capacity of a secondary battery by using a chargeable power amount calculation table.

FIG. 11 is a block diagram of a calculation circuit that calculates a chargeable capacity of a secondary battery by using a chargeable power amount calculation table.

The storage battery system 3 measures the temperature of each battery module in the storage battery system 3, calculates the minimum temperature, and informs the storage battery controller 5 of it. The storage battery system 3, as illustrated in FIG. 2, when the secondary batteries are connected in parallel, also estimates the average SOC, and informs the storage battery controller 5 of it.

The storage battery controller 5 estimates the current degradation rate SOH of a storage battery by using the degradation rate estimation method of a secondary battery described in the first embodiment.

The storage battery controller 5 then calculates the chargeable power amount of the storage battery from the chargeable power amount calculation table, by using the minimum battery temperature, the average SOC, the current charge/discharge power, and the battery degradation rate as parameters. This chargeable power amount is the chargeable power amount relative to the entire capacity of the storage battery.

Similarly, the storage battery controller 5 calculates the chargeable power amount of a secondary battery from the chargeable power amount calculation table 5TC with the minimum battery temperature, the reference SOC at 50%, the current charge/discharge power, and the battery degradation rate as parameters. This chargeable power amount is the chargeable power amount of the secondary battery when the reference SOC is at 50% (in the diagram, illustrated as kWh@SOC50%).

The storage battery controller 5 then functions as a subtracter, and subtracts the chargeable power amount of the secondary battery when the reference SOC is at 50%, from the chargeable power amount relative to the entire capacity of the storage battery.

The storage battery controller 5, if the absolute value of the subtracted value is equal to or less than a half of the operational capacity Cap_1Cap_½, outputs the value obtained by subtracting the chargeable power amount of the secondary battery with the reference SOC at 50%, from the chargeable power amount relative to the entire capacity of the storage battery, without changing, to one of the input terminals of an adder.

A limiter of the storage battery controller 5, if the absolute value of the subtracted value is more than the half of the operational capacity Cap_1, instead of the value obtained by subtracting the chargeable power amount of the secondary battery with the reference SOC at 50% as reference from the chargeable power amount relative to the entire capacity of the storage battery, outputs the half of the operational capacity Cap_1 to one of the input terminals of the adder.

The limiter of the storage battery controller 5, if the absolute value of the subtracted value is less than the half of the operational capacity −Cap_1, instead of the value obtained by subtracting the chargeable power amount of the secondary battery when the reference SOC is at 50% from the chargeable power amount relative to the entire capacity of the storage battery, outputs the half of the operational capacity −Cap_1 to one of the input terminals of the adder.

In parallel to the output to one of the input terminals of the adder, a selector of the storage battery controller 5, if the chargeable power amount of the secondary battery with the reference SOC at 50% (in the diagram, illustrated as kWh@SOC50%) is equal to or more than the half of the operational capacity Cap_1, outputs the half of the operational capacity Cap_1 to the other input terminal of the adder.

The selector of the storage battery controller 5, if the chargeable power amount of the secondary battery with the reference SOC at 50% (in the diagram, illustrated as kWh@SOC50%) is less than the half of the operational capacity Cap_1, outputs the chargeable power amount of the secondary battery with the reference SOC at 50% to the other input terminal of the adder.

In this manner, the adder of the storage battery controller 5 adds the output of the limiter and the output of the selector, and outputs as the chargeable capacity.

More specifically, for example, it is assumed that a storage battery at BOL having the rated capacity of 160 kWh is controlled by limiting the operational capacity Cap_1 to 100 kWh.

When the current battery temperature is 30 degrees Celsius, the SOC is at 30%, the chargeable power amount is 80% (two-hour rate), and the SOH is at 0%, the current chargeable dischargeable capacity with the operational capacity limited to 100 kWh is calculated in the following steps.

(1) A chargeable power amount when the battery temperature is 30 degrees Celsius and the SOC is at 30% is calculated from the chargeable power amount prediction table in the case of charging at the two-hour rate as illustrated in FIG. 8.

More specifically, the chargeable power amount when the battery temperature is 30 degrees Celsius and the SOC is at 30% is calculated to be 139 kWh.

(2) Similarly, a chargeable dischargeable power amount when the reference SOC is at 50% and the battery temperature is 30 degrees Celsius is calculated from the chargeable dischargeable power amount prediction table in the case of charging at the two-hour rate.

More specifically, a chargeable dischargeable power amount when the battery temperature is 30 degrees Celsius and the SOC is at 50% is calculated to be 99 kWh.

(3) Subsequently, the chargeable power amount when the battery temperature is 30 degrees Celsius and the SOC is at 50% (=99 kWh) is subtracted from the chargeable power amount with the battery temperature at 30 degrees Celsius and the SOC at 30% (=139 kWh) (139−99=40 kWh), and the value obtained by the subtraction is limited so that the value is at most the half of the operational capacity Cap_1. In the present example, the value is less than 50 kWh, which is the half of the operational capacity Cap_1, so it stays as 4036 kWh.

(4) Whichever smaller, between the chargeable power amount with the reference SOC at 50% and the battery temperature at 30 degrees Celsius (=99 kWh) and the half of the operational capacity Cap_1 (=50 kWh) (here, 50 kWh), is added to the value (40 kWh) calculated by the above described (3), and the resulting value is to be the chargeable capacity (=90 kWh).

When a storage battery is around the last stage of charging, which is difficult to predict the chargeable/dischargeable power amount, the storage battery control using this operational capacity can prevent the voltage from reaching the end-of-charge voltage or the end-of-discharge voltage before the chargeable power amount becomes 0 kWh, thereby preventing the storage battery system from stopping unexpectedly. Consequently, the host controlling device can always charge the storage battery within a predetermined capacity range, without taking into account the reduced battery capacity occurring due to the battery degradation. In this manner, it is possible to improve the prediction accuracy of the chargeable capacity by predicting based on the chargeable power amount calculation table 5TC corresponding to the battery temperature and the battery's degradation state, compared to the method which limits the battery usage range simply based on the SOC.

Figure 12:
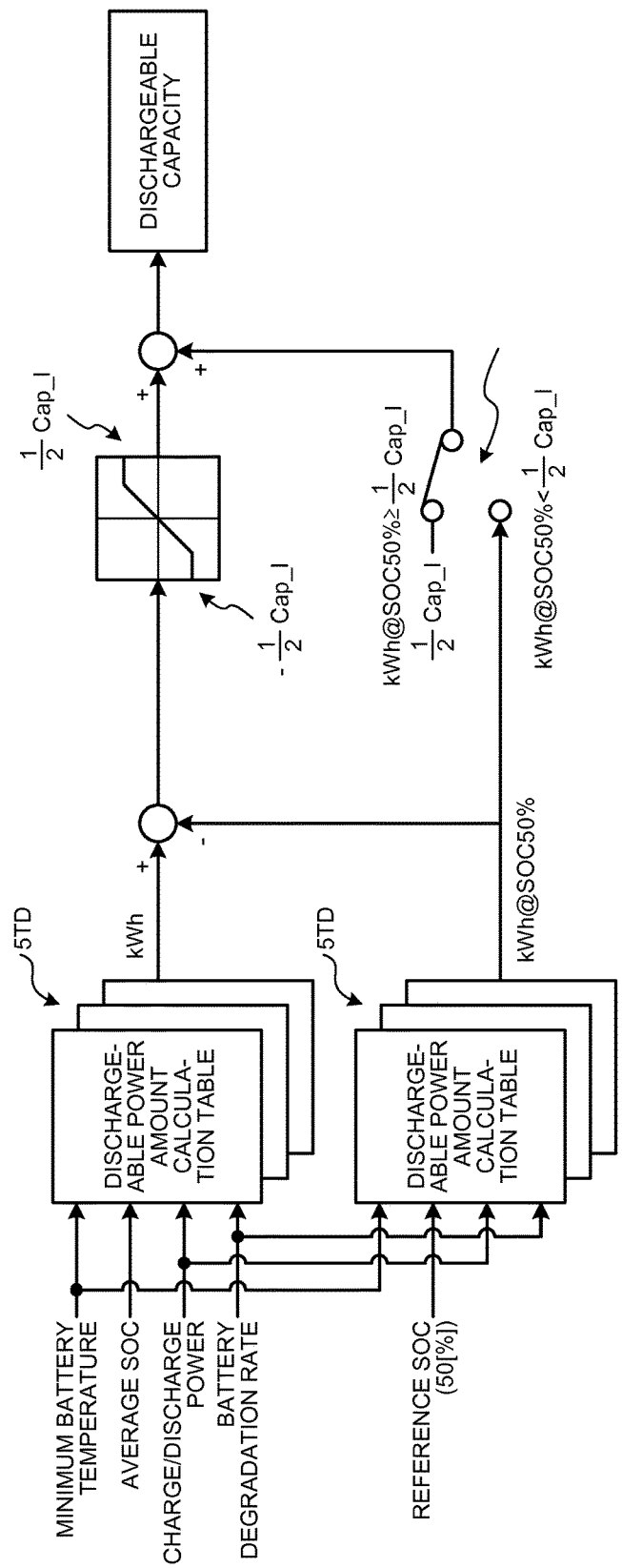
FIG. 12 is a block diagram of a calculation circuit that calculates a dischargeable capacity of a secondary battery by using a dischargeable power amount calculation table.

FIG. 12 is a block diagram of a calculation circuit that calculates a dischargeable capacity of a secondary battery by using a dischargeable power amount calculation table.

The storage battery system 3 measures the temperature of each battery module in the storage battery system 3, calculates the minimum temperature, and informs the storage battery controller 5 of it. The storage battery system 3, as illustrated in FIG. 2, when the secondary batteries are connected in parallel, also estimates the average SOC and informs the storage battery controller 5 of it.

The storage battery controller 5 also estimates the current degradation rate (SOH) of a storage battery, by using the degradation rate estimation method of a secondary battery described in the first embodiment.

The storage battery controller 5 then calculates a dischargeable power amount of the storage battery from the dischargeable power amount calculation table 5TD, by using the minimum battery temperature, the average SOC, the current charge/discharge power, and the battery degradation rate as parameters. This dischargeable power amount is the dischargeable power amount relative to the entire capacity of the storage battery.

Similarly, the storage battery controller 5 calculates a dischargeable power amount of the secondary battery from the dischargeable power amount calculation table 5TD by using the minimum battery temperature, the reference SOC at 50%, the current charge/discharge power, and the battery degradation rate as parameters. This dischargeable power amount is the dischargeable chargeable power amount of the secondary battery when the reference SOC is at 50% (in the diagram, illustrated as kWh@SOC50%).

The subtracter of the storage battery controller 5 then subtracts the dischargeable power amount of the secondary battery when the reference SOC is at 50%, from the dischargeable power amount relative to the entire capacity of the storage battery.

The storage battery controller 5, if the absolute value of the subtracted value is equal to or less than the half of the operational capacity Cap_1Cap_½, then outputs the value obtained by subtracting the dischargeable power amount of the secondary battery with the reference SOC at 50%, from the dischargeable power amount relative to the entire capacity of the storage battery, without changing, to one of the input terminals of the adder.

The limiter of the storage battery controller 5, if the absolute value of the subtracted value is more than the half of the operational capacity Cap_1, instead of the value obtained by subtracting the dischargeable power amount of the secondary battery with the reference SOC at 50% from the dischargeable power amount relative to the entire capacity of the storage battery, outputs the half of the operational capacity Cap_1 to one of the input terminals of the adder.

The limiter of the storage battery controller 5, if the absolute value of the subtracted value is less than the half of the operational capacity −Cap_1, instead of the value obtained by subtracting the dischargeable power amount of the secondary battery with the reference SOC at 50% from the dischargeable power amount relative to the entire capacity of the storage battery, outputs the half of the operational capacity −Cap_1 to one of the input terminals of the adder.

In parallel to the output to one of the input terminals of the adder, the selector of the storage battery controller 5, if the dischargeable power amount of the secondary battery with the reference SOC at 50% (in the diagram, illustrated as kWh@SOC50%) is equal to or more than the half of the operational capacity Cap_1, outputs the half of the operational capacity Cap_1 to the other input terminal of the adder.

The selector of the storage battery controller 5, if the dischargeable chargeable power amount of the secondary battery with the reference SOC at 50% (in the diagram, illustrated as kWh@SOC50%) is less than the half of the operational capacity Cap_1, outputs the dischargeable power amount of the secondary battery with the reference SOC at 50% to the other input terminal of the adder.

In this manner, the adder of the storage battery controller 5 adds the output of the limiter and the output of the selector, and outputs as the dischargeable chargeable capacity.

More specifically, for example, it is assumed that a storage battery at BOL having a rated capacity of 160 kWh is controlled by limiting the operational capacity Cap_1 to 100 kWh.

When the current battery temperature is 30 degrees Celsius, the SOC is at 70%, the dischargeable power amount is 80% (two-hour rate), and the SOH is at 0%, the current dischargeable capacity with the operational capacity limited to 100 kWh is calculated in the following steps.

(1) A dischargeable power amount when the battery temperature is 30 degrees Celsius and the SOC is at 70% is calculated from the dischargeable power amount prediction table in the case of discharging at the two-hour rate as illustrated in FIG. 9.

More specifically, the dischargeable power amount when the battery temperature is 30 degrees Celsius and the SOC is at 70% is calculated to be 126 kWh.

(2) Similarly, a dischargeable power amount with the reference SOC at 50% and the battery temperature is 30 degrees Celsius is calculated from the dischargeable power amount prediction table in the case of discharging at the two-hour rate.

More specifically, the dischargeable power amount when the battery temperature is 30 degrees Celsius and the SOC is at 50% is calculated to be 90 kWh.

(3) Subsequently, the dischargeable power amount with the SOC at 50% (=90 kWh) is subtracted from the dischargeable power amount with the battery temperature at 30 degrees Celsius and the SOC at 70% (=126 kWh) (126−90=36 kWh), and the value obtained by the subtraction is limited so that the value is at most the half of the operational capacity Cap_1. In the present example, the value is less than 50 kWh, which is the half of the operational capacity Cap_1, so it stays as 36 kWh.

(4) Whichever smaller, between the dischargeable power amount with the reference SOC at 50% and the battery temperature at 30 degrees Celsius (=90 kWh) and the half of the operational capacity Cap_1 (=50 kWh) (here, 50 kWh), is added to the value (36 kWh) calculated by the above described (3), and the resulting value is to be the dischargeable capacity (=86 kWh).

When a storage battery is around the last stage of discharging, which is difficult to predict the dischargeable power amount, the storage battery control using this operational capacity can prevent the voltage from reaching the end-of-discharge voltage before the dischargeable power amount becomes 0 kWh, thereby preventing the storage battery system from stopping unexpectedly. The host controlling device can always discharge the storage battery within a predetermined capacity range, without taking into account the reduced battery capacity occurring due to the battery degradation.

As described above, according to the present second embodiment, even at the time of discharging, the operational capacity is calculated so that the actual operational capacity in the expected lifetime falls within the actual capacity range, as well as an operation to shorten the battery life is not performed. Accordingly, because the actual dischargeable capacity is always larger than the dischargeable operational capacity, the operational capacity of a secondary battery can be secured without fail without exceeding the actual capacity limit. Accordingly, it is possible to perform a discharging operation always with the same control without taking the degradation state into account.

To summarize the above, it is possible to improve the prediction accuracy of the chargeable/dischargeable capacity by predicting based on the chargeable/dischargeable power amount calculation table corresponding to the battery temperature and the battery's degradation state, compared to the method which limits the battery usage range simply based on the SOC.

According to the above description, the operational capacity is uniformly distributed to the chargeable/dischargeable power amount at a certain battery temperature and the reference SOC. However, if the operational capacity of a secondary battery (storage battery) from BOL to EOL falls within the actual capacity without fail, the same can be applied regardless of how it is distributed.

[3] Third Embodiment

When a secondary battery (storage battery) is used to suppress output fluctuations of a natural renewable energy power generation device, in order to charge/discharge as required at any time, the host controlling device that controls the storage battery needs to charge and discharge while constantly controlling the SOC so that the storage battery will not be fully charged or completely discharged.

As a result, similar to the second embodiment, a margin is given to the battery capacity according to the expected lifetime of a storage battery, and the storage battery is controlled within the operational capacity with the reference SOC at 50% (limit the usage range of the storage battery).

By contrast, when the power demand has largely increased relative to the power supply ability, it is preferable that it can respond to the situation in which the entire power energy stored in the storage battery is discharged to cut the peak.

In such a case, it is preferable to provide a structure that can release the usage range limit of the storage battery by the operational capacity and control by the entire chargeable/dischargeable capacity.

Accordingly, the host controlling device 6, when the storage battery is preferentially used in a usage such as peak cut, requests to release the usage range limit to the storage battery controller 5 that controls the storage battery system 3.

On receiving the releasing request of the usage range limit, the storage battery controller 5 releases the usage range limit and sets the margin to zero.

More specifically, the operational capacity Cap_1 for limiting the usage range is reset to the actual capacity (BOL) temporarily, and the setting is altered so as to calculate the chargeable/dischargeable capacity.

As a result, the storage battery controller 5 charges/discharges with the entire capacity until the range limit of the upper limit voltage (end-of-charge voltage) and the lower limit voltage (end-of-discharge voltage) of the storage battery, thereby enabling the chargeable/dischargeable capacity to increase temporarily. Consequently, it is possible to operate the system flexibly.

According to the third embodiment, in the natural renewable energy power generation system 100, even if the power demand is largely increased temporarily, it is possible to perform the control corresponding to the power flexibly, by controlling and changing the margin of the battery capacity set when the operational capacity is set.

The storage battery management device according to the present embodiments includes a controlling device such as a central processing unit (CPU), a memory device such as a read-only memory (ROM) and a random access memory (RAM), an external memory device such as a hard disc drive (HDD) and a compact disc (CD) drive device, a display device, and an input device such as a keyboard and a mouse, and has a hardware configuration using an ordinary computer.

A computer program executed in the storage battery management device according to the present embodiments is provided by being recorded in a computer-readable memory medium such as a compact disc read-only memory (CD-ROM), a flexible disk (FD), a compact-disc recordable (CD-R), a digital versatile disc (DVD) in a file of an installable form or an executable form.

The computer program executed in the storage battery management device according to the present embodiments may be stored on a computer connected to a network such as the Internet, and provided by causing a user to download it via the network. The computer program executed in the storage battery management device according to the present embodiments may also be provided or distributed via a network such as the Internet.

The computer program of the storage battery management device according to the present embodiments can also be provided by being incorporated in a ROM or the like in advance.

Some exemplary embodiments of the present invention have been described but such embodiments are not meant to limit the scope of the invention. These new embodiments may be carried out in various other modes, and various omissions, replacements, and modifications are possible without departing from the spirit of the invention. These embodiments and the modifications fall within the scope and spirit of the invention, and also within the invention described in the accompanying claims and their equivalents.

What is claimed is:

1. A storage battery management device that manages a battery system including a secondary battery, the secondary battery connected to a power generation unit which generates and outputs power as system power, wherein the secondary battery charges the generated power or discharges stored power and superimposes the charged or discharged power on the generated power in accordance with a difference between required system power and the generated power, the device comprising:
   chargeable capacity tables for different charge rates, each of which stores therein in advance a chargeable capacity corresponding to a temperature, a state of charge (SOC), a required charge rate, and a battery state of health of the secondary battery;
   dischargeable capacity tables for different discharge rates, each of which store therein in advance a dischargeable capacity corresponding to the temperature, the SOC, a required discharge rate, and the state of health of the secondary battery;
   a controller that calculates an actual chargeable power amount or an actual dischargeable power amount by referring to the chargeable/dischargeable capacity tables or the chargeable/dischargeable capacity tables that correspond to table based on the temperature, the SOC, the required charge rate or discharge rate, and the state of health of the secondary battery; and
   a communication controller that informs a host device about the actual chargeable or dischargeable power amount of the secondary battery,
   wherein the controller controls the charge and discharge of the secondary battery of the battery system in accordance with a charge and discharge control of the host device responding to the informed actual chargeable or dischargeable power amount.

2. The storage battery management device according to claim 1, wherein the controller sets, with a particular margin, the actual chargeable or dischargeable power amount to the chargeable or dischargeable capacity obtained from the referred chargeable or dischargeable capacity.

3. The storage battery management device according to claim 2, wherein the controller, on receiving a request from the host device of the storage battery management device, sets the margin temporarily to zero.

4. The storage battery management device according to claim 2, wherein the controller sets the actual chargeable or dischargeable power amount based on a reference SOC set in advance.

5. The storage battery management device according to claim 1, wherein the controller calculates the state of health based on a measurement value or an estimation value of an internal resistance value of the secondary battery.

6. The storage battery management device according to claim 1, wherein the chargeable dischargeable capacity tables store the chargeable and dischargeable capacities calculated by simulation using an equivalent circuit model of the secondary battery and a characteristic value of the secondary battery.

7. A method, executed by a storage battery management device that manages a battery system including a secondary battery, the secondary battery connected to a power generation unit which generates and outputs power as system power, wherein the secondary battery charges the generated power or discharges stored power and superimposes the charged or discharged power on the generated power in accordance with a difference between required system power and the generated power, wherein the device includes chargeable capacity tables for different charge rates, each of which stores therein in advance a chargeable capacity corresponding to a temperature, a state of charge (SOC), a required charge rate, and a battery state of health of a secondary battery, and dischargeable capacity tables for different discharge rates, each of which store therein in advance a dischargeable capacity corresponding to the temperature, the SOC, a required discharge rate, and the battery state of health of the secondary battery the method comprising:
   referring to either the chargeable capacity tables or the dischargeable capacity tables that correspond to the temperature, the SOC, the required charge rate or discharge rate, and the state of health of the secondary battery;
   calculating an actual chargeable power amount or an actual dischargeable power amount;
   informing a host device about the actual chargeable or dischargeable power amount of the secondary battery; and
   controlling the charge and discharge of the secondary battery of the battery system in accordance with a charge and discharge control of the host device responding to the informed actual chargeable or dischargeable power amount.

8. A computer program product including programmed instructions embodied in and stored on a non-transitory computer readable medium, wherein the instructions for controlling a storage battery management device that manages a battery system including a secondary battery, the secondary battery connected to a power generation unit which generates and outputs power as system power, wherein the secondary battery charges the generated power or discharges stored power and superimposes the charged or discharged power on the generated power in accordance with a difference between required system power and the generated power, chargeable capacity tables for different charge rates, each of which store therein in advance a chargeable capacity corresponding to a temperature, a state of charge (SOC), a required charge rate, and a battery state of health of the secondary battery, and dischargeable capacity tables for different discharge rates, each of which store therein in advance a dischargeable capacity corresponding to the temperature, the SOC, a required discharge rate, and the battery state of health of the secondary battery, when executed by a computer, cause the computer to perform:
   referring to either the chargeable capacity tables or the dischargeable capacity tables that correspond to the temperature, the SOC, the required charge rate or discharge rate, and the battery state of health of the secondary battery;

calculating an actual chargeable power amount or an actual dischargeable power amount;

informing a host device about the actual chargeable or dischargeable power amount of the secondary battery; and controlling the charge and discharge of the secondary battery of the battery system in accordance with a charge and discharge control of the host device responding to the informed actual chargeable or dischargeable power amount.

* * * * *